US007750313B2

(12) United States Patent
Fujita et al.

(10) Patent No.: US 7,750,313 B2

(45) **Date of Patent: *Jul. 6, 2010**

(54) ION SOURCE

(75) Inventors: Hideki Fujita, Kyoto (JP); Sei Umisedo, Kyoto (JP); Nariaki Hamamoto, Kyoto (JP)

(73) Assignee: Nissin Ion Equipment Co., Ltd., Kyoto (JP)

( * ) Notice: Subject to any disclaimer, the term of this patent is extended or adjusted under 35 U.S.C. 154(b) by 149 days.

This patent is subject to a terminal disclaimer.

(21) Appl. No.: 12/076,979

(22) Filed: Mar. 26, 2008

(65) Prior Publication Data

US 2008/0277593 A1 Nov. 13, 2008

Related U.S. Application Data

(63) Continuation-in-part of application No. 11/434,891, filed on May 17, 2006, now Pat. No. 7,365,339.

(30) Foreign Application Priority Data

May 17, 2005 (JP) ............................ 2005-144376

(51) Int. Cl.

*H01J 49/10* (2006.01)
*H01J 49/16* (2006.01)
*H01J 37/08* (2006.01)
*H01J 27/02* (2006.01)

(52) U.S. Cl. .................. 250/423 R; 250/427; 250/426; 315/111.81; 313/346 R

(58) Field of Classification Search ............ 250/423 R, 250/427, 426; 315/111.81; 313/346 R
See application file for complete search history.

(56) References Cited

U.S. PATENT DOCUMENTS

| | | | | |
|---|---|---|---|---|
| 5,497,006 | A | 3/1996 | Sferlazzo et al. | |
| 5,703,372 | A * | 12/1997 | Horsky et al. | 250/423 R |
| 6,878,946 | B2 * | 4/2005 | Farley et al. | 250/427 |
| 7,365,339 | B2 * | 4/2008 | Fujita et al. | 250/423 R |
| 2004/0061068 | A1 | 4/2004 | Farley et al. | |

FOREIGN PATENT DOCUMENTS

| | | |
|---|---|---|
| JP | A-07-262946 | 10/1995 |
| JP | A-10-134728 | 5/1998 |
| JP | 2995388 | 10/1999 |
| WO | WO 01/88947 | 11/2001 |
| WO | WO 02/078033 | 10/2002 |

* cited by examiner

*Primary Examiner*—Nikita Wells
(74) *Attorney, Agent, or Firm*—Finnegan, Henderson, Farabow, Garrett & Dunner, L.L.P.

(57) ABSTRACT

A cathode holder of a tubular shape is inserted into an opening for a cathode of a plasma generating chamber, the cathode holder positioned such that a surface thereof opposes or surrounds a side surface of a cathode. The cathode is held in the cathode holder so that a front surface of the cathode will be positioned on the same plane as, outward from, or inward from the inner wall surface. In the cathode holder is provided a tubular first heat shield surrounding the cathode with a space provided between the first heat shield and the cathode, a surface of the first heat shield positioned to oppose or surround the side surface of the cathode. At a rear end of the cathode is provided a filament. The gap between the cathode holder and the plasma generating chamber is filled with an electrical insulating material.

10 Claims, 3 Drawing Sheets

*FIG. 2*
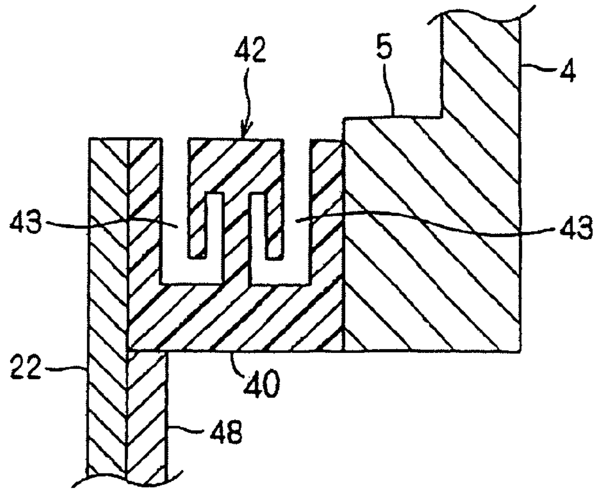
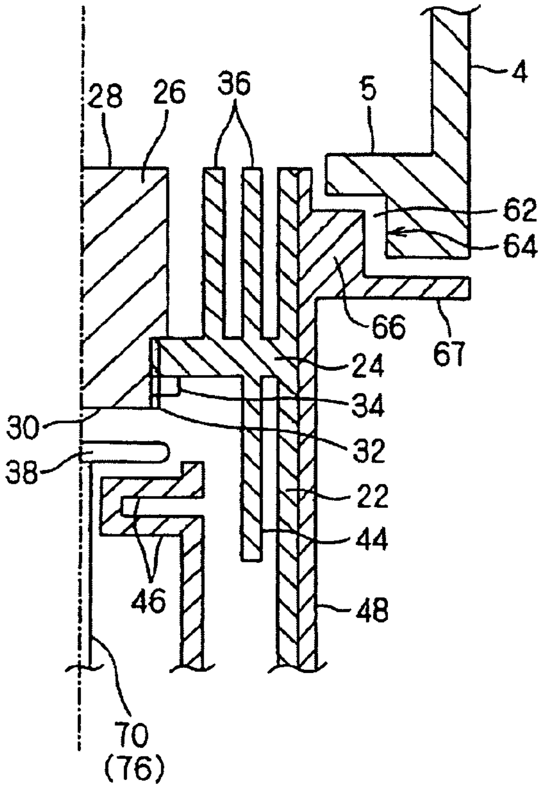
*FIG. 3*

ION SOURCE

The present application is a continuation in part of U.S. patent application Ser. No. 11/434,891, which claims foreign priority based on Japanese Patent Application No. 2005-144376, filed May 17, 2005, now U.S. Pat. No. 7,365,339 the content of which is incorporated herein by reference.

BACKGROUND OF THE INVENTION

1. Technical Field

The present invention relates to an ion source having a structure where a cathode is heated by a filament to emit thermal electrons for generating plasma into a plasma generating chamber also serving as an anode. Such anion source is also referred to as an indirectly heated cathode type ion source.

2. Related Art

This type of related art ion source has a structure where a tubular cathode holder is inserted into a plasma generating chamber with a gap between itself and the plasma generating chamber and a cathode is held at the tip of the cathode holder and a filament to heat the cathode is arranged in the cathode holder (for example, refer to JP-2995388, paragraph 0009, FIG. 6; JP-A-10-134718, paragraph 0009, FIG. 7; U.S. Pat. No. 2004/0061668 A1, paragraph 002, FIG. 1).

In the ion source, the tubular cathode holder is inserted into the plasma generating chamber, and an area where the plasma is generated is made smaller by at least the volume of the cathode holder. This lowers the ionization efficiency of a gas for generating plasma in the plasma generating chamber thus degrading the plasma generation efficiency as well as reduces the plasma volume. Therefore, it is difficult to increase the beam current of ion beams to be extracted from the ion source.

The gap between the cathode holder and the plasma generating chamber serves as an escape route of the gas for generating plasma. This lowers the use efficiency of the gas. The gas for generating plasma generally cost high. A reduced use efficiency of the gas leads to a higher operation cost of the ion source. Leakage of gas may contaminate a structure on the periphery of the plasma generating chamber, which shortens the service life of the ion source.

Further, the cathode wears with the operation time of the ion source. Although a larger axial length of the cathode (or depth of the cathode) is advantageous in terms of the service life of the cathode, and thus, the ion source, it is difficult to provide a long cathode in the related art ion source. A longer cathode results in a larger heat loss caused by emission from the side surface of the cathode, which makes it difficult to heat the cathode. Moreover, the cathode holder is heated up to a high temperature and thermal electrons are emitted therefrom. This may cause unwanted electric discharge (arc discharge) between the cathode holder and the plasma generating chamber thus causing a loss as well as contaminating the inside of the plasma generating chamber.

SUMMARY OF THE INVENTION

An object of the invention is to improve the plasma generation efficiency and gas use efficiency as well as ensure a longer service life of an ion source.

However, the present invention need not achieve the above object, and other objects not described herein may also be achieved. Further, the invention may achieve no disclosed objects without affecting the scope of the invention.

A first ion source according to the invention is an ion source having a structure where a cathode is heated by a filament and thermal electrons are emitted from the cathode into a plasma generating chamber also serving as an anode, the ion source comprising: an opening for a cathode provided in the wall surface of the plasma generating chamber; a tubular cathode holder for holding the cathode, the tip of which is inserted into the opening for the cathode from outside the plasma generating chamber so as to leave a gap between the tip and the plasma generating chamber, the cathode holder positioned such that an inner surface thereof opposes a side surface of the cathode; a cathode held in the cathode holder, the front surface of the cathode positioned on the same plane with the inner wall surface around the opening for a cathode of the plasma generating chamber, further outward from the plasma generating chamber, or at least partially within the plasma generating chamber; a tubular first heat shield arranged to enclose the side surface of the cathode by at least one layer with a gap provided between itself and the side surface of the cathode; a filament provided in the cathode holder for heating the cathode from its rear surface; and an electrical insulating material provided in the opening for a cathode, the electrical insulating material filling the gap between the cathode holder and the plasma generating chamber.

According to the first ion source, the cathode is positioned on the same plane with the inner wall surface around the opening for a cathode of the plasma generating chamber, further outward from the plasma generating chamber, or at least partially within the plasma generating chamber.

The gap between the cathode holder and the plasma generating chamber is filled with an electrical insulating material. This prevents possible leakage of a gas for generating plasma and improves the gas use efficiency.

Further, the first heat shield suppresses a heat loss caused by emission from the side surface of the cathode. It is thus possible to increase the length of the cathode. This assures a longer life of the cathode, and by extension, the ion source.

The electrical insulating material may be positioned inside the plasma generating chamber and have a labyrinthine structure part having a bent cross section at the part surrounding the tip of the cathode holder.

A second ion source according to the invention is an ion source having a structure where a cathode is heated by a filament and thermal electrons are emitted from the cathode into a plasma generating chamber also serving as an anode, the ion source comprising: an opening for a cathode provided in the wall surface of the plasma generating chamber; a tubular cathode holder for holding the cathode, the tip of which is inserted into the opening for the cathode from outside the plasma generating chamber so as to leave a gap between the tip and the plasma generating chamber, the cathode holder positioned such that an inner surface thereof opposes a side surface of the cathode; a cathode held in the cathode holder, the front surface of the cathode positioned on the same plane with the inner wall surface around the opening for a cathode of the plasma generating chamber, further outward from the side of the plasma generating chamber, or at least partially within the plasma generating chamber; a tubular first heat shield arranged to enclose the side surface of the cathode by at least one layer with a gap provided between itself and the side surface of the cathode; and a filament provided in the cathode holder for heating the cathode from its rear surface; characterized in that a labyrinthine structure part having a bent cross section is formed in a gap between the cathode holder and the plasma generating chamber.

According to the second ion source, it is possible to improve the plasma generation efficiency and extend the service life of the ion source.

It is possible to reduce the conductance of a gas by way of a labyrinthine structure part formed in a gap between the cathode holder and the plasma generating chamber. This suppresses possible leakage of a gas for generating plasma thereby improving the gas use efficiency.

The member on the cathode holder side forming a labyrinthine structure part between the plasma generating chamber and the cathode holder may be formed of an electrical insulating material.

The cathode holder may include a second tubular heat shield arranged to surround the side surface of the filament by at least one layer with a space provided between the second heat shield and the filament.

The cathode holder may include a third heat shield arranged to cover the rear surface of the filament by at least one layer with a space provided between the third heat shield and the filament.

The cathode may have a male screw part formed at the rear part and is detachably held at a holding part provided in the cathode holder by way of the male screw part and a nut screwed with the male screw part.

The filament may have a heating part in the shape of a flat plate bent along the rear surface of the cathode.

The filament may have a heating part in the shape of a round bar filament material bent along the rear surface of the cathode and the heating part may have a flat surface obtained by machining a round-bar-shaped filament material and the flat surface may be opposed to the rear surface of the cathode.

The ion source may have a heat insulating material covering the part on the outer peripheral surface of the cathode holder, the part positioned outside the plasma generating chamber.

According to a first aspect of the invention, the cathode is positioned on the same plane with the inner wall surface around the opening for a cathode of the plasma generating chamber, further outward from the plasma generating chamber, or at least partially within the plasma generating chamber.

The gap between the cathode holder and the plasma generating chamber is filled with an electrical insulating material. This prevents possible leakage of a gas for generating plasma and improves the gas use efficiency. As a result, it is possible to reduce the gas use amount thus reducing the operation cost of an ion source. It is also possible to prevent contamination of a structure on the periphery of the plasma generating chamber caused by a gas leakage, which contributes to a longer life of the iota source.

Further, the first heat shield suppresses a heat loss caused by emission from the side surface of the cathode. It is thus possible to increase the length of the cathode. This assures a longer life of the cathode, and by extension, the ion source.

According to a second aspect of the invention, the electrical insulating material has a labyrinthine structure part. Even when the creepage distance becomes longer and conductive impurities are deposited on the surface of the electrical insulating material to form a conductive film, the film reduces the chance of electrical short between the cathode holder and the plasma generating chamber. As a result, it is possible to assure a longer service life of an ion source.

According to a third aspect of the invention, the advantage due to the configuration except that a labyrinthine structure part is provided instead of an electrical insulating material of the first aspect of the invention is the same as that offered by the first aspect of the invention.

According to the invention, it is possible to lower the conductance of a gas by way of a labyrinthine structure part formed in a gap between the cathode holder and the plasma generating chamber. This suppresses possible leakage of a gas for generating plasma thereby improving the gas use efficiency it is thus possible to prevent contamination of a structure on the periphery of the plasma generating chamber caused by a gas leakage, which contributes to a longer life of the ion source.

According to a fourth aspect of the invention, the member on the cathode holder side forming a labyrinthine structure part between the plasma generating chamber and the cathode holder is formed of an electrical insulating material. Even in case conductive impurities are deposited on the surface of the gap of the labyrinthine structure part to form a conductive film and the film peels off and thin pieces (flakes) are formed, it is possible to prevent electrical short between the cathode holder and the plasma generating chamber. This contributes to a longer service life of an ion source.

According to a fifth aspect of the invention, it is possible to reduce a heat loss caused by emission from a filament by way of the second heat shield, thus enhancing the heating efficiency of the cathode by the filament.

According to a sixth aspect of the invention, it is possible to reduce a heat loss caused by emission from a filament by way of the third heat shield, thus enhancing the heating efficiency of the cathode by the filament.

According to a seventh aspect of the invention, the cathode is detachably held by its male screw part and a nut. This makes it possible to replace easily a cathode with a new one when it is worn. As a further advantage, the male screw part requires a smaller area of contact with the nut, and by extension, the cathode holder, compared with fit. This reduces a heat loss caused by conduction of heat from the cathode to the cathode holder and enhances the heating efficiency of the cathode.

According to an eighth aspect of the invention, the filament has a heating part of the shape of a flat plate. Thus, the thermal electron emission area from the filament to the cathode is larger than when a round-rod-shaped filament is used. As a result, for example to obtain a thermal electron emission amount equivalent to that of a round-rod-shaped filament, the temperature of the filament may be lowered to extend the service life of the filament. It is also possible to extend the length of between the cathode and the filament, which assures stable operation against thermal expansion of the filament or a member on the periphery of the cathode.

According to a ninth aspect of the invention, the filament has a heating part of a flat surface. Thus, the thermal electron emission area from the filament to the cathode is larger than when a round-rod-shaped filament is used. As a result, for example to obtain a thermal electron emission amount equivalent to that of a round-rod-shaped filament, the temperature of the filament may be lowered to extend the service life of the filament. It is also possible to extend the length of between the cathode and the filament, which assures stable operation against thermal expansion of the filament or a member on the periphery of the cathode.

According to a tenth aspect of the invention, the heat insulating material may reduce emission from the cathode holder thus enhancing the heating efficiency of the cathode. Moreover, it is not necessary to additionally heat the member on the periphery of the cathode holder. This reduces the thermal expansion of the periphery member, maintains the mechanical accuracy between the cathode and the filament, thus stabilizing thermal electron emission from the filament.

BRIEF DESCRIPTION OF THE DRAWINGS

FIG. 2 is an enlarged view of Part C in FIG. 1; and

FIG. 3 is a cross-sectional view of another example of the cathode and its periphery;

DETAILED DESCRIPTION OF THE INVENTION

Figure 1:
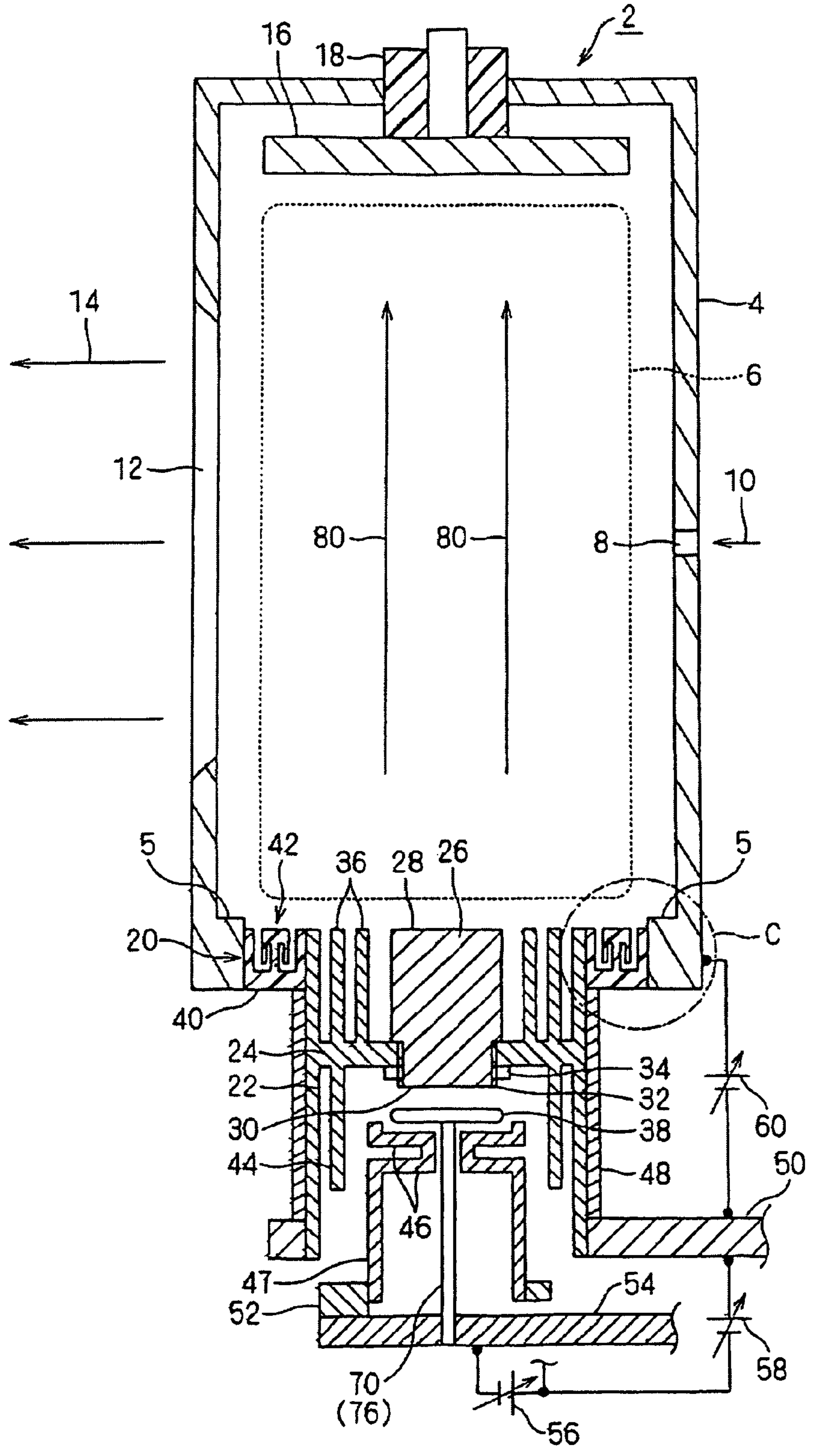
FIG. 1 is cross-sectional view-of an exemplary, non-limiting embodiment of an ion source according to the invention.

FIG. 1 is cross-sectional view of an exemplary, non-limiting embodiment of an ion source according to the invention. FIG. 2 is an enlarged view of Part C in FIG. 1.

An ion source 2 has a structure to heat a cathode 26 by a filament 38 and emit thermal electrons from the cathode 26 into a plasma generating chamber 4 also serving as an anode. The ion source 2 is sometimes called an indirectly heated cathode type ion source.

The plasma generating chamber 4 is for example of a rectangular parallelepiped. Into the plasma generating chamber 4 is introduced a desired gas (including in the state of vapor) 10 for generating plasma 6 via a gas inlet 8. The gas 10 includes desired elements (for example dopant of B, P, As). To be more specific, the gas may include a material gas such as $BF_3$, $PH_3$, $A_3H_3$ and $B_2H_6$.

In one wall surface of the plasma generating chamber 4 (on one of the long side walls) is provided an ion extraction port 12 for extracting ion beams 14. The ion extraction port 12 has the shape of a narrow slit in the longitudinal direction of the wall surface.

In another wall surface of the plasma generating chamber 4 (on one of the short side walls) is provided an opening 20 for a cathode for positioning a cathode. The front shape of the opening 20 for a cathode has the shape of a circle in this example. Inside a wall surface opposed to a wall surface including the opening 20 for a cathode is held, via an electrical insulating material 18, a reflector 16 for reflecting electrons in the plasma 6 while opposed to the cathode 26.

The reflector 16 may be put to floating potential without being connected anywhere as in this example. Or, the reflector 16 may be put to cathode potential while connected to a support body 50 for a cathode (in other words, a negative electrode end of an are power supply 60).

As shown in this example, a magnetic field 80 along an axis connecting the cathode 26 and the reflector 16 may be applied to the inside of the plasma generating chamber 4 from a magnet (not shown) for generating/maintaining the plasma 6 provided outward from the plasma generating chamber 4. The orientation of the magnetic field 80 may be opposite to that shown.

The tip of a cathode holder 22 in a tubular shape (cylindrical shape in this example) for holding the cathode 26 is inserted into the opening 20 for a cathode from outside of the plasma generating chamber 4 with a gap provided between its tip and the plasma generating chamber 4. Note that the gap is filled with an electrical insulating material 40. In this example, the tip of the cathode holder 22 is positioned further outward from the plasma generating chamber 4 than an inner wall surface 5 on the periphery of the opening 20 for a cathode in the plasma generating chamber. Note that the tip of the cathode holder 22 may be positioned such that the inner surface thereof opposes or surrounds a side surface of the cathode. The cathode holder 22 is composed of molybdenum (Mo) for example. This also holds true for a holding part 24, a first heat shield 36, a second heat shield 44, a third heat shield 46, a support body 50, 52 and a filament current conductor 54 mentioned later.

In the cathode holder 22 in this example is held the cathode 26 in the shape of a column (to be more specific, a cylindrical column) with a space provided between its side surface and the cathode holder 22. A front surface 28 of the cathode 26 is positioned further outward from the plasma generating chamber 4 than the inner wall surface 5 on the periphery of the opening 20 for a cathode in the plasma generating chamber 4. Note that the front surface 28 of the cathode 26 may be positioned on the same surface as the inner wall surface 5 or the front surface 28 of the cathode, as well as additional portions of cathode 26, can be positioned beyond the inner wall surface 5, at least partially within the plasma generating chamber 4. The cathode 26 is composed of tungsten (N) for example. This also holds true for a nut 34 and a filament 38 mentioned later.

The cathode 26 in this example has a male screw part 32 formed at the rear part and is detachably held at the holding part 24 provided in the intermediate part of the cathode holder 22 by way of the male screw part 32 and the nut 34 screwed with the male screw part.

In the cathode holder 22 is provided the first heat shield 36 in a tubular shape (cylindrical shape in this example) so as to surround the side surface of the cathode 26 by at least one layer (two layers in this example) with a space provided between the side surface of the cathode holder 26 and the first heat shield 36. Each first heat shield 36 is erected integrally to the holding part 24 of the cathode holder 22 in this example.

In the vicinity of the rear surface 30 of the cathode 26 in the cathode holder 22 is provided the filament 38 for heating the cathode 26 from its rear surface 30. A specific example of the filament 38 will be described later.

In the opening 20 for a cathode in the plasma generating chamber 4 is provided an electrical insulating material 40 filling the gap between the cathode holder 22 and the plasma generating chamber 4. The electrical insulating material 40 is composed of boron nitride (BN) for example. This also holds true for a heat insulating material 48 mentioned later.

In this example, the electrical insulating material 40 has a labyrinthine structure part 42 having a bent cross section at a part surrounding the tip of the cathode 26 in a circular fashion while positioned in the plasma generating chamber 4. The labyrinthine structure part 42 has a gap 43 bent in the shape of a hook on the inner periphery and outer periphery, as shown in FIG. 2.

In this example, a second heat shield 44 in a tubular shape (cylindrical shape in this example) so as to surround the side surface of the filament 38 by at least one layer (one layer in this example) with a space provided between the filament 38 and the second heat shield 44. The second heat shield 44 is erected integrally to the holding part 24 of the cathode holder 22 in this example.

In this example, a third heat shield 46 in a tubular shape (cylindrical shape in this example) so as to cover the rear surface of the filament 38 by at least one layer (two layers in this example) with a space provided between the filament 38 and the third heat shield 46. The third heat shield 46 is erected integrally to the tip of the tabular part 47.

The cathode holder 22 is supported in position by the support body 50. The filament 38 is supported in position by two filament current conductors 54 via its two legs 70 (or 76) (only one of the two conductors and two legs are shown). The third heat shield 46 is supported in position by one filament current conductor 54 via the tubular part 47 and the support body 52.

To the ends of the filament 38, or to be more specific, to its two legs 70 (or 76) is connected a filament power supply 56 for heating the filament 38. One end of the filament 38 and the third heat shield 46 are put at the same potential via the support body 52 and the tubular part 47. The filament power supply 56 may be a DC poser supply as shown or an AC power supply.

Between the filament 38 and the cathode 26 is connected a DC heating power supply 58, which accelerates thermal electrons emitted from the filament 38 to the cathode 26 and heating the cathode 26 with the impact of the thermal electrons, via the cathode holder 22 and with the cathode 26 serving as a positive pole.

Between the cathode 26 and the plasma generating chamber 4 is connected a DC arc power supply 60, which accelerates thermal electrons emitted from the cathode 26 and ionizing the gas 10 introduced into the plasma generating chamber 4 as well as causes arc discharge in the plasma generating chamber 4 to generate plasma 6, with the plasma generating chamber 4 at the positive pole.

According to the ion source 2, the filament 38 is used to heat the cathode 26 and thermal electrons are emitted from the cathode 26 into the plasma generating chamber 4. The thermal electrons ate used to cause arc discharge in the plasma generating chamber 4 and the gas 10 introduced into the plasma generating chamber 4 is ionized to generate the plasma 6. From the plasma 6, it is possible to extract ion beams 14 via the ion extraction port 12 by the action of the electric field. In the vicinity of the exit of the ion extraction port 12 is generally provided an extraction electrode for extracting the ion beams 14.

According to the ion source 2, the cathode 26 is positioned on the same plane with the inner wall surface 5 around the opening 20 for a cathode of the plasma generating chamber 4, further outward from the side of the plasma generating chamber 4, or at least partially within the plasma generating chamber 4.

The gap between the cathode holder 22 and the plasma generating chamber 4 is filled with the electrical insulating material 40. This prevents possible leakage of the gas 10 for generating plasma and improves the use efficiency of the gas 1.0. As a result, it is possible to reduce the use amount of the gas 10 thus reducing the operation cost of the ion source 2. It is also possible to prevent contamination of a structure on the periphery of the plasma generating chamber, for example the support body 50 and the an insulator or some insulators (not shown) for supporting the filament current conductor 54, caused by leakage of the gas 10, which contributes to a longer life of the ion source 2.

It is possible to suppress a heat loss caused by emission from the side surface of the cathode 26 by way of the first heat shield 36. This ensures a longer service life of the cathode 26, and thus, the ion source 2. For example, the thickness of a cathode is 5 to 8 mm at most in a related art ion source although the thickness of the cathode 26 of the ion source 2 may be as thick as 10 to 15 mm.

According to this embodiment, the electrical insulating material 40 has the labyrinthine structure part 42. Since the creepage distance becomes longer, even when conductive impurities are deposited on the surface of the electrical insulating material 40 to form a conductive film, it is possible to reduce the chance of electrical short between the cathode holder 22 and the plasma generating chamber 4 by the film. As a result, it is possible to assure a longer service life of the ion source 2.

It is possible to reduce a heat loss caused by emission from the filament 38 byway of the second heat shield 44. This further enhances the heating efficiency of the cathode 26 by the filament 38.

It is possible to reduce a heat loss caused by emission from the filament 38 by way of the third heat shield 46. This further enhances the heating efficiency of the cathode 26 by the filament 38.

The cathode 26 is detachably held by its male screw part 32 and the nut 34. This makes it possible to replace the cathode 26 with a new one when it is worn. As a further advantage, the male screw part 32 is in the line contact state and requires a smaller area of contact with the nut 34, and thus, the cathode holder 22 (to be more specific, its holding part 24), compared with fit. This reduces a heat loss caused by conduction of heat from the cathode 26 to the cathode holder 22 and enhances the heating efficiency of the cathode 26.

Figure 4A:
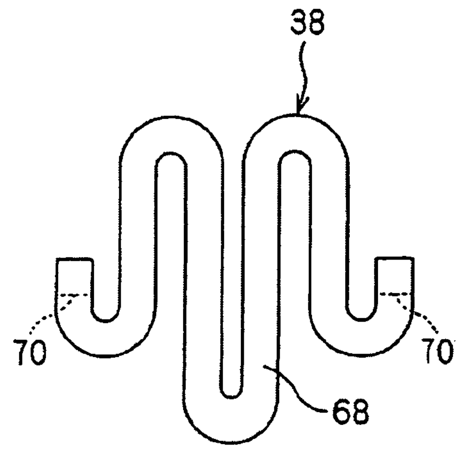
FIG. 4A is a front view of an example of a filament.
Figure 4B:
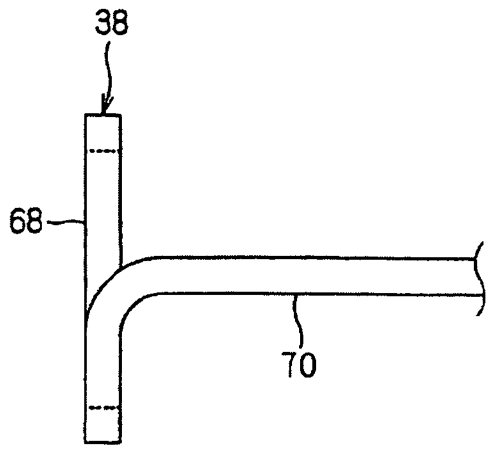
FIG. 4B is a left side view of an example of a filament.

The filament 38 may have a heating part 68 in the shape of a flat plate bent along the rear surface 30 of the cathode 26 as shown in FIG. 4. Both ends of the heating part 68 are connected to two legs 70.

Use of the filament 38 expands the area of emission of thermal electrons from the filament 38 to the cathode 26, thus increasing the thermal electron emission amount. As a result, for example, to obtain a thermal electron emission amount equivalent to that of a round-rod-shaped filament, the temperature of the filament 38 may be lowered to extend the service life of the filament 38. It is also possible to increase the length of the distance between the cathode 26 and the filament 38 thus stabilizing operation against thermal expansion of a member on the periphery of the filament 38 and the cathode 26.

Figure 5A:
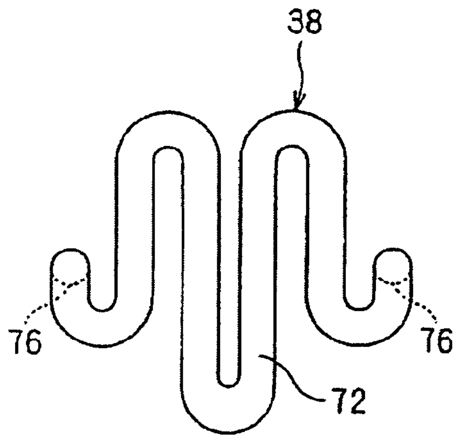
FIG. 5A is a front view of another example of a filament.
Figure 5B:
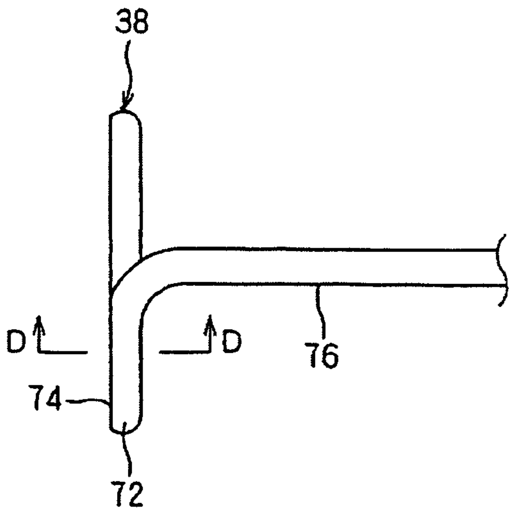
FIG. 5B is a left side view of another example of a filament.
Figure 6:
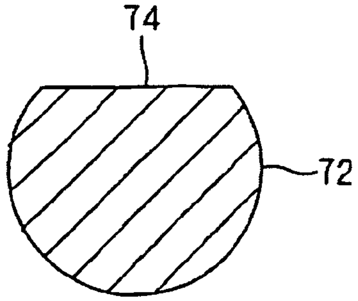
FIG. 6 shows an enlarged cross section along the filament line D-D shown in FIG. 5.

The filament 38 has a heating part 72 in the shape of a round bar filament material bent along the rear surface 30 of the cathode 26 as in the example shown in FIGS. 5 and 6. The heating part 72 has a flat surface 74 obtained by machining (for example cutting) a round-bar-shaped filament material and the flat surface 74 may be opposed to the rear surface 30 of the cathode 26. Both ends of the heating part 72 are connected to two legs 76.

When a general round-bar-shaped filament is used, only one end of its circular cross section may be brought into the vicinity of the rear surface of the cathode 26 and the electric field between the remaining parts and the cathode is weakened with a smaller amount of thermal electrons emitted. Use of the filament 38 allows its flat surface 74 to be brought closer to the rear surface 30 of the cathode 26. Compared with the general round-bar-shaped filament, it is possible to increase the area of emission thermal electrons from the filament 38 to the cathode 26, thereby increasing the thermal electron emission amount. As a result, for example, to obtain a thermal electron emission amount equivalent to that of a general round-rod-shaped filament, the temperature of the filament 38 may be lowered to extend the service life of the filament 38. It is also possible to increase the length of the distance between the cathode 26 and the filament 38 thus stabilizing operation against thermal expansion of a member on the periphery of the filament 38 and the cathode 26.

Referring to FIG. 1 again, as in this embodiment, a heat insulating material 48 may be provided covering the part on the outer peripheral surface of the cathode holder 22, the part positioned outside the plasma generating chamber 4. In this example, the entire outer peripheral surface of the cathode holder from the heat insulating material 48 to the support body 50 is covered by the heat insulating material 48. The heat insulating material 48 may be also called a heat shielding material or a warm material. This also holds true for the heat insulating material 48 shown in FIG. 3. The heat insulating material 48 is composed of boron nitride (BN) for example.

The heat insulating material 48 reduces an emission heat from the cathode holder 22 thus enhancing the heating efficiency of the cathode 26. Moreover, it is not necessary to additionally heat the member on the periphery of the cathode holder, for example the support body 50. This reduces the thermal expansion of the peripheral member, maintains the mechanical accuracy between the cathode 26 and the filament 38, and stabilizes the thermal electron emission from the filament 38.

Instead of filling the gap between the cathode holder 22 and the plasma generating chamber 4 with the electrical insulating material 40, it is possible to form a labyrinthine structure part 64 having a cross section bent for example in a zigzag shape at the gap 62 between the cathode holder 22 and the plasma generating chamber 4. While the labyrinthine structure part 64 is formed by attaching a labyrinth forming member 66 separate from the cathode holder 22 on the outer peripheral surface of the tip of the cathode holder 22 in the example of FIG. 3, the tip of the cathode holder 22 may be formed into the same shape as the labyrinth forming member 66 to form the labyrinthine structure part 64.

By forming the labyrinthine structure part 64 instead of arranging a straight gap between the cathode holder 22 and the plasma generating chamber 4, it is possible to reduce the conductance of a gas at the gap 62 by forming the labyrinthine structure part 64. This suppresses possible leakage of the gas 10 to improving the use efficiency of the gas 10. As a result, it is possible to reduce the use amount of the gas 10 thus reducing the operation cost of the ion source 2. It is also possible to prevent contamination of a structure on the periphery of the plasma generating chamber caused by the leakage of the gas 10, which contributes to a longer life of the ion source 2.

The labyrinth forming member 66 on the side of the cathode holder 22 for forming the labyrinthine structure part 64 by using an electrical insulating material (such as boron nitride). With this configuration, even in case conductive impurities are deposited on the gap 62 of the labyrinthine structure part 64 to forma conductive film and the film peels off and thin pieces (flakes) are formed, it is possible to prevent electrical short between the cathode holder 22 and the plasma generating chamber 4. This contributes to a longer service life of the ion source 2.

As in the example shown in FIG. 3, it is possible to form the labyrinth forming member 66 and the heat insulating material 46 with a material serving as an electrical insulating material and a heat insulating material, for example an integrated member composed of boron nitride (BN). Or, it is possible to form the flange 67 and the heat insulating material in the labyrinth forming member 66 with an integrated member composed of such a material.

It will be apparent to those skilled in the art that various modifications and variations can be made to the described preferred embodiments of the present invention without departing from the spirit or scope of the invention. Thus, it is intended that the present invention cover all modifications and variations of this invention consistent with the scope of the appended claims and their equivalents.

We claim:

1. An ion source having a structure where a cathode is heated by a filament and thermal electrons are emitted from the cathode into a plasma generating chamber also serving as an anode, the ion source comprising:

an opening for a cathode provided in the wall surface of said plasma generating chamber;

a tubular cathode holder for holding the cathode, the tip of which is inserted into the opening for the cathode from outside said plasma generating chamber so as to leave a gap between the cathode holder and the plasma generating chamber, the cathode holder opposing or surrounding a side surface of the cathode;

the cathode held in the cathode holder, a front surface of the cathode positioned on the same plane with the inner wall surface around the opening for the cathode of the plasma generating chamber, further outward from the plasma generating chamber, or at least partially within the plasma generating chamber;

a tubular first heat shield arranged to oppose or surround a side surface of the cathode by at least one layer with a gap provided between the first heat shield and the side surface of the cathode;

a filament provided in the cathode holder for heating the cathode from a rear surface of the cathode; and an electrical insulating material provided in the opening for the cathode, the electrical insulating material filling the gap between the cathode holder and the plasma generating chamber.

2. The ion source according to claim 1, wherein the electrical insulating material is positioned inside the plasma generating chamber and has a labyrinthine structure part having a bent cross section at a part surrounding the tip of the cathode holder.

3. An ion source having a structure where a cathode is heated by a filament and thermal electrons are emitted from the cathode into a plasma generating chamber also serving as an anode, the ion source comprising:

an opening for a cathode provided in the wall surface of said plasma generating chamber;

a tubular cathode holder for holding the cathode, the tip of which is inserted into the opening for the cathode from outside said plasma generating chamber so as to leave a gap between the cathode holder and the plasma generating chamber, the cathode holder opposing or surrounding a side surface of the cathode;

the cathode held in the cathode holder, a front surface of the cathode positioned on the same plane with the inner wall surface around the opening for the cathode of the plasma generating chamber, further outward from the plasma generating chamber, or at least partially within the plasma generating chamber;

a tubular first heat shield arranged to oppose or surround a side surface of the cathode by at least one layer with a gap provided between the first heat shield and the side surface of the cathode;

a filament provided in the cathode holder for heating the cathode from a rear surface of the cathode; and a labyrinthine structure part having a bent cross section formed in the gap between the cathode holder and said plasma generating chamber.

4. The ion source according to claim 3, wherein a member on the cathode holder side forming the labyrinthine structure part between the plasma generating chamber and the cathode holder is formed of an electrical insulating material.

5. The ion source according to claim 3, wherein the cathode holder includes a second tubular heat shield arranged to surround a side surface of the filament by at least one layer with a space provided between the second heat shield and the filament.

6. The ion source according to claim 3, wherein the cathode holder includes a third heat shield arranged to cover a rear surface of the filament by at least one layer with a space provided between the third heat shield and the filament.

7. The ion source according to claim 3, wherein the cathode has a male screw part formed at the rear part and detachably held at a holding part provided in the cathode holder by way of the male screw part and a nut screwed with the male screw part.

8. The ion source according to claim 3, wherein the filament has a heating part in the shape of a flat plate bent along the rear surface of the cathode.

9. The ion source according to claim 3, wherein the filament has a heating part in the shape of a round-bar-shaped filament material bent along the rear surface of the cathode, that the heating part has a flat surface obtained by machining the round-bar-shaped filament material, and that the flat surface is opposed to the rear surface of the cathode.

10. The ion source according to claim 3, further comprising:

a heat insulating material covering a part on an outer peripheral surface of the cathode holder, the part positioned outside the plasma generating chamber.

* * * * *